United States Patent [19]

Chahabadi et al.

[11] Patent Number: 5,461,340
[45] Date of Patent: Oct. 24, 1995

[54] AMPLITUDE DEMODULATOR FOR RADIO RECEIVERS TO COMPENSATE FOR FIELD STRENGTH INFLUENCE

[75] Inventors: Djahanyar Chahabadi, Hildesheim; Lothar Vogt, Hohenhameln, both of Germany

[73] Assignee: Robert Bosch GmbH, Stuttgart, Germany

[21] Appl. No.: 288,555

[22] Filed: Aug. 10, 1994

[30] Foreign Application Priority Data

Sep. 11, 1993 [DE] Germany ............................ 43 30 891.0
Mar. 19, 1994 [DE] Germany ............................ 44 09 474.4

[51] Int. Cl.$^6$ ................................ H03D 1/06; H03D 1/00
[52] U.S. Cl. ......................... 329/349; 329/361; 375/317; 455/337
[58] Field of Search ..................................... 329/347, 349, 329/358, 361; 455/202, 337; 375/317, 318

[56] References Cited

U.S. PATENT DOCUMENTS

| 4,631,499 | 12/1986 | Kasperkovitz | 331/15 X |
| 4,972,163 | 11/1990 | Van Der Plas | 331/17 X |
| 5,093,930 | 3/1992 | Kasperkovitz | 331/15 X |
| 5,241,702 | 8/1993 | Dent | 329/325 X |

Primary Examiner—David Mis
Attorney, Agent, or Firm—Frishauf, Holtz, Goodman, Langer & Chick

[57] ABSTRACT

In an amplitude demodulator for radio receivers, an intermediate frequency signal is converted into a digital intermediate frequency signal. The digital intermediate frequency signal is mixed into the baseband and amplitude demodulated. Either the intermediate frequency signal, or the amplitude demodulated signal, is controlled and amplified or attenuated so that the DC component of the amplitude demodulated signal is kept constant.

14 Claims, 3 Drawing Sheets

AMPLITUDE DEMODULATOR FOR RADIO RECEIVERS TO COMPENSATE FOR FIELD STRENGTH INFLUENCE

Cross-reference to related applications, assigned to the assignee of the present invention, the disclosures of which are hereby incorporated by reference U.S. Ser. No. 08/183,026, CHAHABADI et al, filed 18 Jan. 1994; U.S. Ser. No. 08/183,029, VOGT et al, filed 18 Jan. 1994; U.S. Ser. No. 08/192,505, VOGT et al, filed 3 Feb. 1994; and U.S. Ser. No. 08/288,554, filed Oct. 10, 1994.

FIELD OF THE INVENTION

The invention relates generally to an amplitude demodulator for a radio receiver, e.g. a vehicle radio.

THE INVENTION

It is an object of this invention to provide an amplitude demodulator for radio receivers that primarily are designed with digital technology, allowing an amplitude demodulator with digital design to make use of the pulse signals that are present in the radio receiver.

The amplitude demodulator according to the invention features an intermediate frequency signal that is converted into a digital intermediate frequency signal. The digital intermediate frequency signal is mixed into the baseband and amplitude demodulated. Either the digital intermediate frequency signal, or of the amplitude demodulated signal, is controlled and simplified attenuation so that the DC component of the amplitude demodulated signal is kept constant.

A significant advantage of the amplitude demodulator according to the invention is that the influence of field strength fluctuations in a preset level range is compensated for by a digital circuit.

One advantageous embodiment of the invention provides, that the amplitude demodulated signal passes through a multiplier to control the amplification, that the DC component is separated from the output signal of the multiplier using a low-pass filter, and that a control variable is derived from the separated DC component and supplied to the multiplier. Moreover, the control variable can be derived from the DC component according to a gradient method.

In another advantageous embodiment of the invention, the digital intermediate frequency signal can be supplied to a mixer that forms two orthogonal components which, after low-pass filtering and decimation of the sampling rate, are supplied via a multiplier each to a processor for summation in the sense of vector sum formation of the orthogonal components. From the output signal of the arithmetic unit, which presents the amplitude demodulated signal superimposed on the DC component stemming from the amplitude of the unmodulated carrier, the DC component is separated with a low-pass filter. A control variable is then derived from the separated DC component and supplied to the multipliers.

Compensation of the fluctuating DC component, caused by the field strength fluctuations as well, is possible with the amplitude demodulator according to the invention by subtracting the separated DC component from the controlled amplitude demodulated signal and the result of this subtraction being supplied to an output of the amplitude demodulator.

In addition, the amplitude demodulator according to the invention may feature that the DC component is additively and multiplicatively supplied with adjustment factors before forming the control variable.

An improvement of the amplitude demodulator, subject to the invention, features the DC components passing through an additional multiplier and an additional subtractor in the process of forming the control variable. The output signal of the additional subtractor is supplied to the additional multiplier and the additional subtractor via a delay device and after amplitude limiting forms the control variable.

When deriving the control variable for volume control, wanted audio information other than the DC component should not become effective. To accomplish this, a low-pass filter with a very low limit frequency is needed. According to another improvement of the invention, this is made possible without much expense in that the low pass filter for deriving the DC components consists of a low pass filter, a decimation stage, and a second low pass filter.

To realize a multiplication of the control variable with the amplitude demodulated signal, it is provided that the sampling frequency of the control variable is increased before supplying it to the multiplier.

An advantageous design for performing the gradient method consists of the delay device's providing a delay of one sampling period of the DC component.

For the amplitude demodulator according to the invention, mixing into the baseband including amplitude demodulation can be performed in an advantageous manner by the mixed signal, which is subsequently low pass filtered, being produced in the form of two squared components by supplying appropriately phase shifted reference carriers. It may be advantageous to divide the low pass filtering into several stages with the sampling frequency being decimated between each of these stages. In this manner, each subsequent low pass filter can be realized with less expense. After shifting down into the baseband, an algorithm can be used to produce the vector sum from the squared components of the mixed signal shifted down into the baseband. This sum then represents the amplitude demodulated signal which is supplied to the multiplier.

DRAWINGS

Further features of the preferred embodiment will be apparent from block diagrams shown in the drawings, of which:

Figure 3:
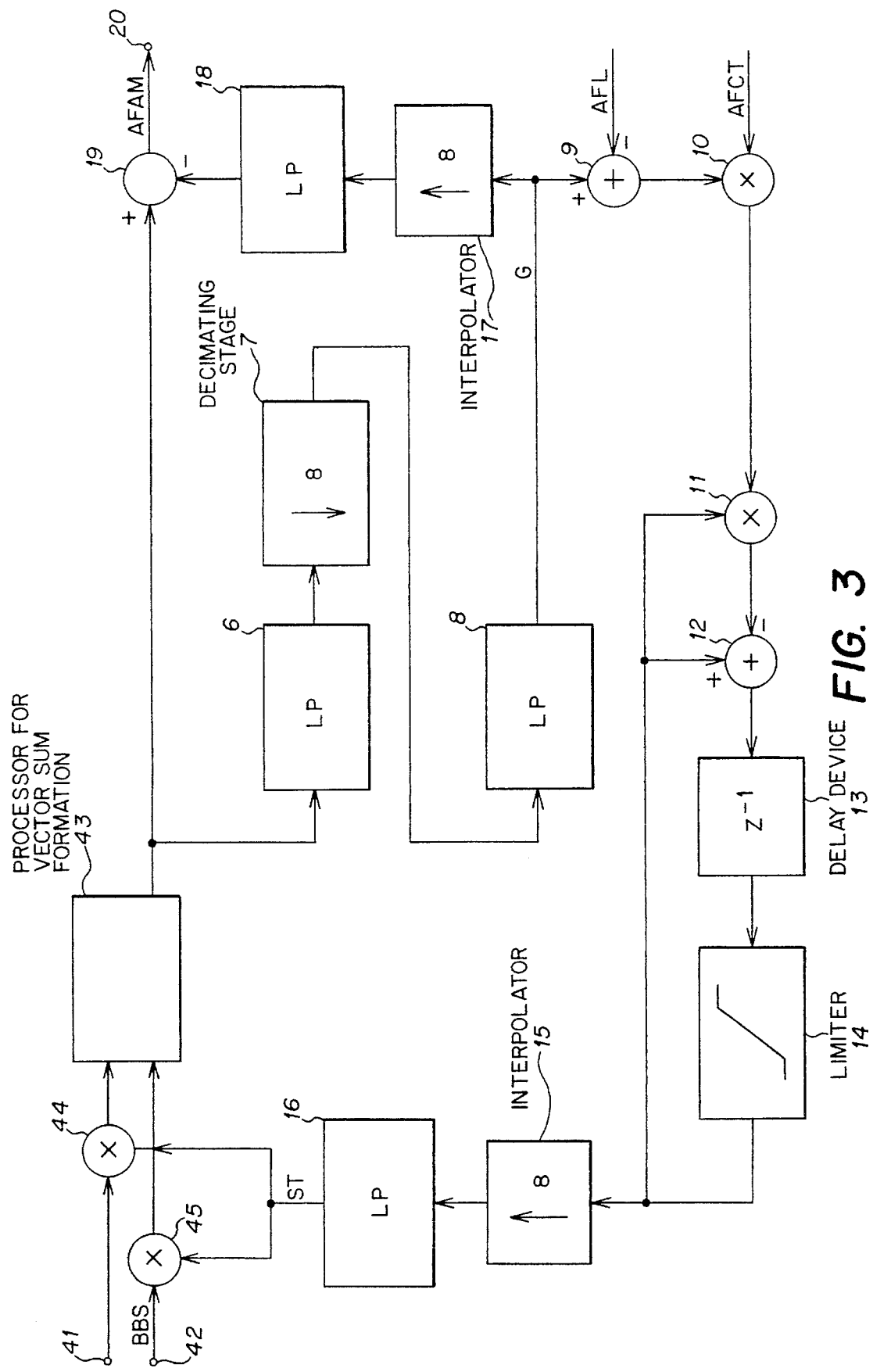

FIG. 3 a more specific presentation of a part of the second embodiment.

The same components are labeled with the same reference numerals in each drawing. The exemplary embodiment of the invention and parts thereof are shown as block diagrams. However, this does not imply that the circuit design according to the invention is limited to implementation through the conformity of individual blocks to their corresponding circuits. Rather, the circuit of the invention can be implemented in a particularly advantageous manner using highly integrated circuits. It is possible to employ digital signal processors, which, if programmed accordingly, can perform the processing steps depicted in the block diagrams. Any of the leading digital signal processors commonly used in radio receivers can be suitably programmed. Alternately, the circuit of the invention can form significant portions of a radio receiver, when combined with other circuits as part of an application-specific integrated circuit.

DETAILED DESCRIPTION

At 1, the amplitude demodulator according to the invention is supplied with an intermediate frequency signal, which is sampled with a frequency of 14.25 MHz and converted into a digital intermediate frequency signal in an analog/digital converter 2. In a subsequent mixer 3, this signal is mixed into the baseband and demodulated by amplitude demodulator. It may be advantageous to lower the original sampling rate of 14.25 MHz to a sampling frequency required for further processing of the audio frequency signal, for instance to 45.6 kHz. In addition to the wanted audio frequency information, the output signal of the amplitude demodulator 4 still includes a DC component that stems from the amplitude of the unmodulated AM carrier. The amplitude of the output signal AMF of the demodulator depends on this as well. To compensate for this dependency, a multiplier 5 is provided that multiplies the signal AMF with a control variable ST. This control variable is derived from the DC component of the signal AMF, as described below.

To derive the DC component, the output signal of multiplier 5 is low pass filtered. Since low pass filtering of the DC component is to be accomplished in a narrow band, to avoid triggering the control by low frequency portions of the audio signal, a low limit frequency is required. For this purpose, the output signal AMK of the multiplier 5 is low pass filtered a first time by low pass filter 6, then decimated at circuit 7 by a factor of eight with regard to the sampling rate, and then low pass filtered a second time by low pass filter 8. The DC component G, available at the output of low pass filter 8, is now subjected to level and time constant adjustment for control. For this purpose, a subtractor 9 and a multiplier 10 are provided that can be supplied with adjustment factors AFL and AFCT for the control level and time constant.

The DC component, adjusted in this manner, is converted into the control variable ST using a gradient method. For this purpose, the DC component is supplied via an additional multiplier 11 and an additional subtractor 12 to a delay device 13, where it is delayed by one sampling period of the DC component G. The delay device is followed by a limiter 14, whose output signal y is limited at both ends. The purpose of the limiter is to establish the level range that is to be controlled. The limiter 14 can also be placed ahead of the delay device. In such a case, the not delayed limited signal can be used as control variable.

To increase the sampling rate, the output signal y of the limiter is interpolated at 15 and low pass filtered at 16, and then supplied to the multiplier 5 as control variable ST.

To remove the DC component from the signal AMK, the DC component G, subsequent to interpolation at 17 and low pass filtering at 18, is supplied to a subtractor 19, at whose output 20 the demodulated audio signal AFAM is available.

Figure 2:
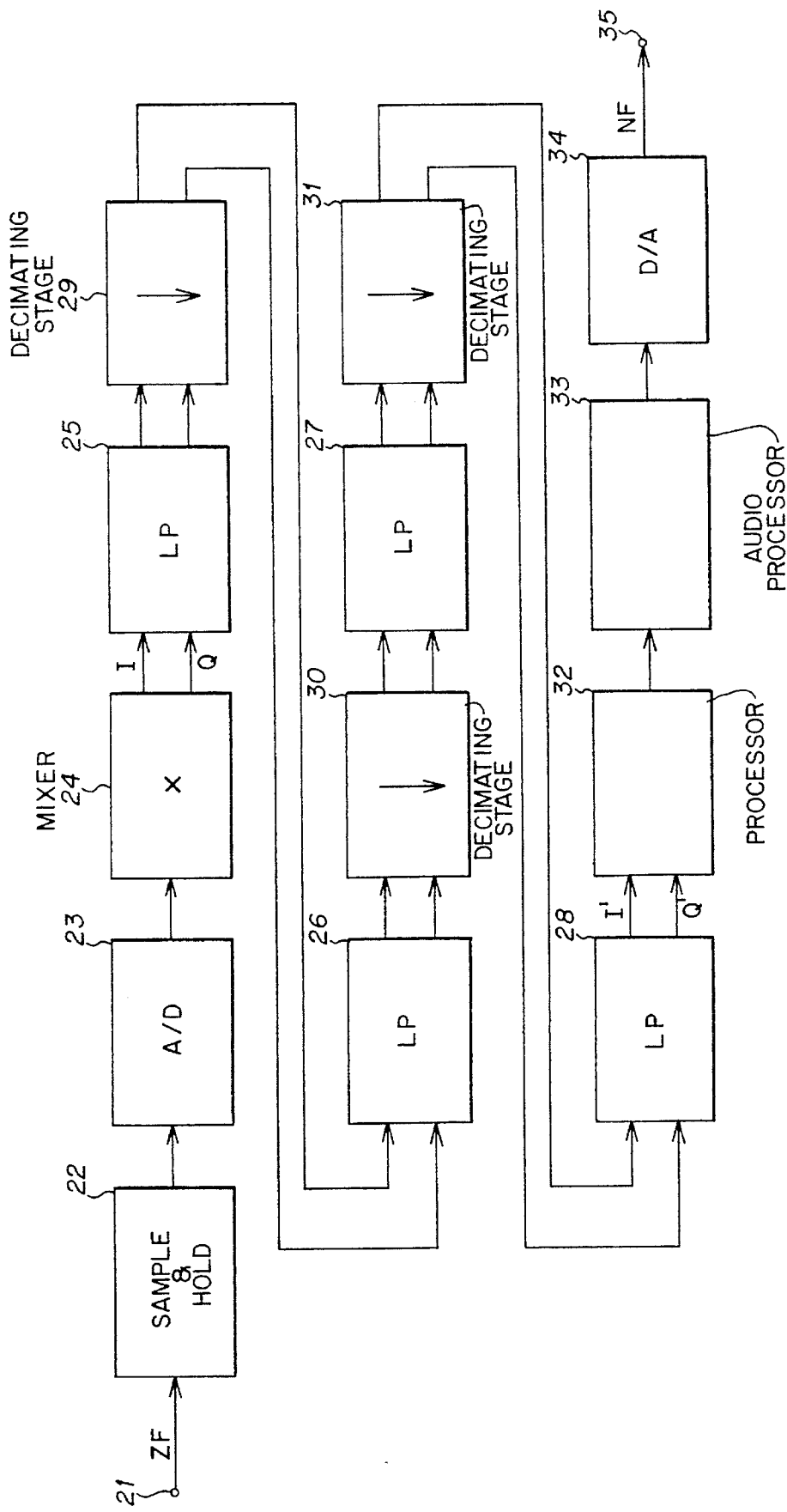
FIG. 2 is a second embodiment.

In the embodiments shown in FIGS. 2 and 3, amplification control is performed in the processor 32 prior to summation. The processor contains two orthogonal components of the digital intermediate frequency signal, which has already been mixed into the baseband. More specifically, an analog intermediate frequency signal is, for this purpose, at 21 supplied to the circuit shown in FIG. 2 and via a sample and hold circuit 22 to an analog/digital converter 23. The output of the analog/digital converter is connected to a mixer 24, where the digital intermediate frequency signal is mixed with two orthogonal mix signals in a generally known manner, resulting in the formation of two components I and Q. This signal is low pass filtered in several stages and decimated with regard to its sampling rate. For this purpose, four low pass filters 25, 26, 27, 28, and three decimating stages 29, 30, 31 are provided.

With decimating stage 29, the sampling rate of the digital intermediate frequency signal is initially decimated to 456000 1/s. Decimating stage 30 results in a sampling rate of 228000 1/s, while decimating stage 31 results in a sampling rate of 45600 1/s. Through filtering with the low pass filter 28, the complex baseband signal of the wanted channel is freed of wanted and interfering signals of the neighboring channels.

Components I' and Q' are then supplied to a circuit 32, which is explained in greater detail in FIG. 3 and which provides at its output the amplitude demodulated signal. This signal is supplied to output 35 of the circuit according to FIG. 2 via a circuit 33 for audio processing and a digital/analog converter 34. Circuit 33 for audio processing contains, for instance, volume and tone control elements.

Figure 1:
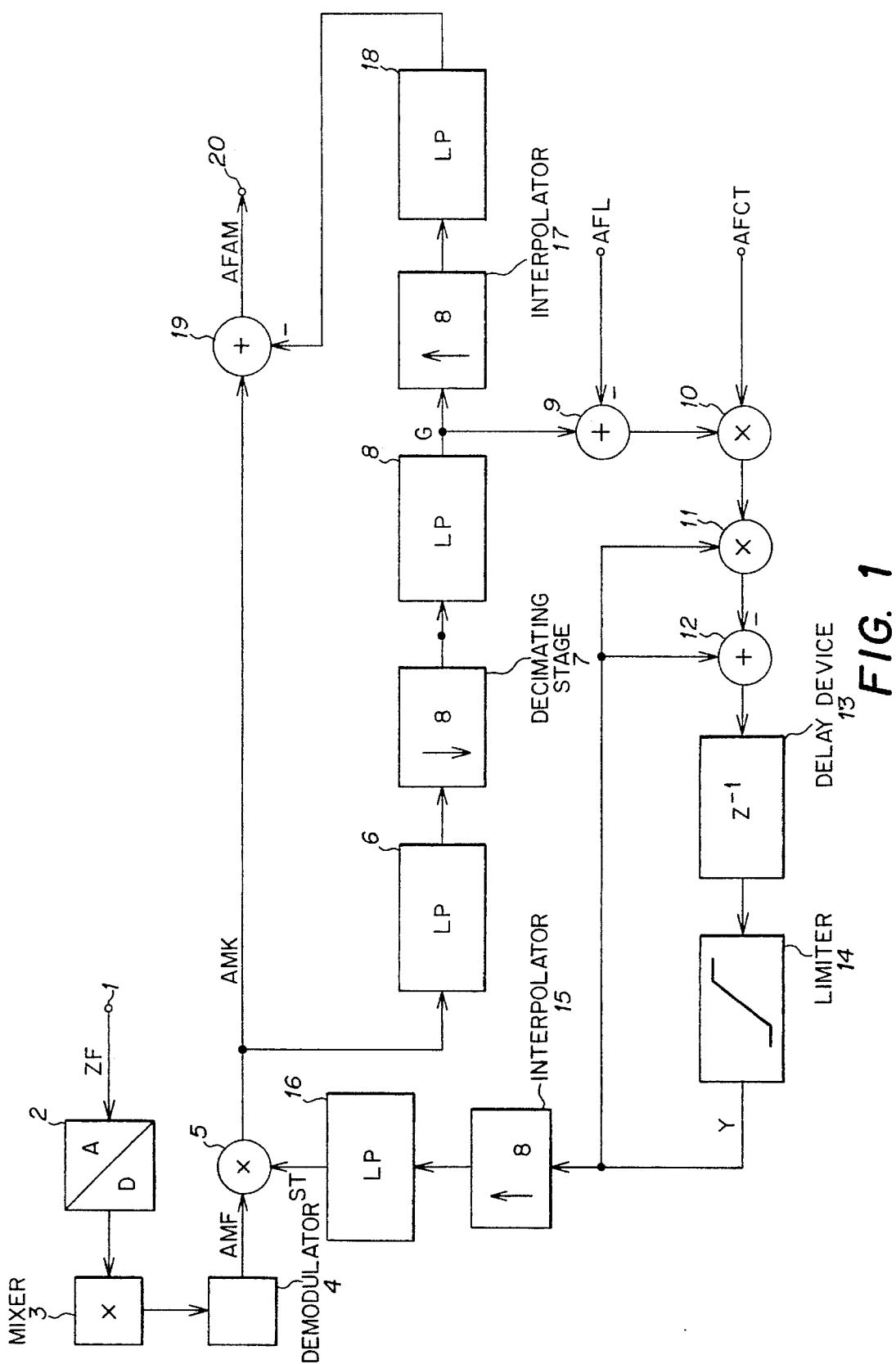
FIG. 1 is a first embodiment.

FIG. 3 shows circuit 32 (FIG. 2) in greater detail. From the low pass filter 28 (FIG. 2), the components of the digital intermediate frequency signal BBS, which has been shifted down into the baseband, are supplied to inputs 41, 42. A processor for vector sum formation 43 is provided for demodulation. It is preceded by two multipliers 44, 45. The amplitude demodulated signal is available at the output of the processor 43. Just as in the exemplary embodiment according to FIG. 1, the unwanted DC component of the signal is measured and used to derive a control variable that is supplied to multipliers 44, 45 for controlling the amplification of the signals being supplied to the processor 43. Subtraction of the resultant DC component from the amplitude demodulated signal for the exemplary embodiment according to FIGS. 2 and 3 is carried out in the same manner as for the exemplary embodiment according to FIG. 1 as well. Compared to the exemplary embodiment according to FIG. 1, the second exemplary embodiment has the advantage that the dynamic of the signal is already reduced prior to vector sum formation. Thus, a lower word width is sufficient for representation and processing of the signals in the subsequent circuit.

Various changes and modifications are possible within the scope of the inventive concept. In particular, features of one embodiment may be combined with features of another embodiment, or with features of one of the applications cross-referenced at the beginning of the present specification.

What is claimed is:

1. Amplitude demodulator for radio receivers, comprising:
    means for converting an intermediate frequency signal into a digital intermediate frequency signal;
    means for mixing the digital intermediate frequency signal into a baseband, and for producing therefrom an amplitude demodulated signal;
    means for determining a DC-component of the amplitude demodulated signal; and
    means for controlling the intermediate frequency signal, or the amplitude demodulated signal, to keep the DC component of the amplitude demodulated signal constant.

2. Amplitude demodulator according to claim 1, further comprising a multiplier (5) through which the amplitude demodulated signal passes to control the amplification; a low pass filter (6,7,8) for separating the DC component from the output signal of the multiplier (5); and means for deriving a control variable from the separated DC component and supplying said control variable to the multiplier (5).

3. Amplitude demodulator according to claim 1, further comprising a mixer (24) which receives the digital intermediate frequency signal to form two orthogonal components, which are supplied via multipliers (44, 45) to a processor (43) for summation in the sense of vector sum formation of the orthogonal components subsequent to low pass filtering and decimation of a sampling rate; wherein from the output signal of the processor (43), representing the amplitude demodulated signal superimposed with a DC component stemming from an amplitude of an unmodulated carrier, the DC component is separated via a low pass filter (6, 7, 8); and means for deriving from the separated DC component a control variable that is supplied to the multipliers (44, 45).

4. Amplitude demodulator according to claim 2, wherein the control variable is derived from the DC component according to a gradient method.

5. Amplitude demodulator according to claim 3, wherein the control variable is derived from the DC component according to a gradient method.

6. Amplitude demodulator according to claim 2, wherein the separated DC component is subtracted from the controlled amplitude demodulated signal, and wherein the result of the subtraction is supplied to an output of the amplitude demodulator.

7. Amplitude demodulator according to claim 3, wherein the separated DC component is subtracted from the controlled amplitude demodulated signal, and wherein the result of the subtraction is supplied to an output of the amplitude demodulator.

8. Amplitude demodulator according to claim 4, wherein the separated DC component is subtracted from the controlled amplitude demodulated signal, and wherein the result of the subtraction is supplied to an output of the amplitude demodulator.

9. Amplitude demodulator according to claim 2, wherein adjustment factors are supplied to the DC component additively or multiplicatively prior to formation of the control variable.

10. Amplitude demodulator according to claim 4, wherein, for the purpose of forming the control variable, the DC component passes through an additional multiplier (11) and an additional subtractor (12), whose output signal is supplied to the additional multiplier (11) and to the additional subtractor (12) via a delay device (13) and forms the control variable subsequent to amplitude limiting (14).

11. Amplitude demodulator according to claim 6, wherein, for the purpose of forming the control variable, the DC component passes through an additional multiplier (11) and an additional subtractor (12), whose output signal is supplied to the additional multiplier (11) and to the additional subtractor (12) via a delay device (13) and forms the control variable subsequent to amplitude limiting (14).

12. Amplitude demodulator according to claim 2, wherein the low pass filter for deriving the DC component includes a first low pass filter (6), a decimating stage (7), and a second low pass filter (8).

13. Amplitude demodulator according to claim 8, wherein a sampling frequency of the control variable is raised prior to being supplied to the multiplier (5).

14. Amplitude demodulator according to claim 7, wherein a delay device (13) exhibits a delay of one sampling period of the DC component.

* * * * *

UNITED STATES PATENT AND TRADEMARK OFFICE
CERTIFICATE OF CORRECTION

PATENT NO. : 5,461,340
DATED : October 24, 1995
INVENTOR(S) : CHAHABADI et al.

It is certified that error appears in the above-indentified patent and that said Letters Patent is hereby corrected as shown below:

Title page, Item [73] Assignee, delete: "Robert Bosch GmbH, Stuttgart, Germany";

insert: --Blaupunkt-Werke GmbH, Hildesheim, Germany--

Signed and Sealed this

Seventh Day of May, 1996

Attest:

BRUCE LEHMAN

*Attesting Officer*    *Commissioner of Patents and Trademarks*